March 19, 1963 J. A. LOVELL ET AL 3,082,356

AMPLIFIER CHASSIS

Filed April 7, 1961 2 Sheets-Sheet 1

INVENTORS
JAMES A. LOVELL
WILLIAM L. HAMILTON
BY Gust & Irish

ATTORNEYS

March 19, 1963 J. A. LOVELL ET AL 3,082,356

AMPLIFIER CHASSIS

Filed April 7, 1961 2 Sheets-Sheet 2

INVENTORS
JAMES A. LOVELL
WILLIAM L. HAMILTON
BY Dush & Irish

ATTORNEYS

United States Patent Office 3,082,356
Patented Mar. 19, 1963

3,082,356
AMPLIFIER CHASSIS
James A. Lovell and William L. Hamilton, Indianapolis, Ind., assignors to Industrial Development Engineering Associates, Inc., Indianapolis, Ind.
Filed Apr. 7, 1961, Ser. No. 101,566
1 Claim. (Cl. 317—101)

The present invention relates to an amplifier chassis and more particularly to a chassis adapted to mount one or more printed circuit boards and the like.

Electronic equipment composed of printed circuits, transistors and other miniature components is quite compact, small in size and in some instances somewhat fragile. While the practical problems involved are fully understood and comprehended by a person skilled in the art, it is well to mention that the printed circuit boards must be properly supported and conveniently secured in place. Furthermore, if a plurality of such circuit boards are used, it is usually desirable to provide electrostatic shielding therebetween. Additionally, it is necessary to provide some means for facile servicing of the equipment, and to this end it is desirable to be able to demount printed circuit boards so that access may be gained to the intricate circuitry thereof. A still further consideration involves the convenience in assembling and disassembling the total equipment in connection with the servicing and repairing thereof.

The present invention is unique in that it provides for all of the foregoing requirements while at the same time achieve the features of simplicity, economy and mechanical rigidity.

It is therefore an object of this invention to provide a chassis for mounting and locking in place a plurality of printed circuit boards and the like.

It is another object of this invention to provide a locking device for securing a printed circuit board of its supporting chassis.

It is a further object of this invention to provide a chassis having a plurality of electrostatic shields which separate a plurality of circuit boards, such shields serving indirectly as supporting members for the circuit boards and directly as parts of locking devices for securing the circuit boards in place.

It is yet another object of this invention to provide a circuit board-locking device wherein the board itself and a portion of the supporting chassis constitute functioning parts of the locking device itself.

Other objects will become apparent as the description proceeds.

These objects are achieved by providing an amplifier chassis comprising a metallic base plate having spaced apart lateral edges, a pair of metallic mounting plates mounted in an upright position on the base plate, these mounting plates being spaced apart and parallel and extending the full distance between the lateral edges of the base plate, each of the mounting plates having a pair of elongated guide rails mounted on one side adjacent to the opposite lateral edges thereof, the guide rails being upright and having longitudinally extending upright grooves, respectively, facing each other, each mounting plate having an upper edge and a screw affixed thereto to extend upwardly beyond the upper edge, a printed circuit board slidably received by the grooves in one pair of guide rails, the circuit board being of substantially the same size and shape as the mounting plates, the circuit board having an upper edge fitted with a bracket which overlies the upper edge of the mounting plate in registry with the screw, a nut fixedly mounted for rotation on the bracket and being threaded onto said screw, the circuit board having a lower edge, a male circuit plug mounted on the circuit board adjacent to the lower edge thereof, and a socket mounted on the base plate and receiving said male plug, said nut securing said circuit board in the aforementioned grooves and also said plug in the aforesaid socket.

The above-mentioned and other features and objects of this invention and the manner of attaining them will become more apparent and the invention itself will be best understood by reference to the following description of an embodiment of the invention taken in conjunction with the accompanying drawings, wherein.

Figure 1:
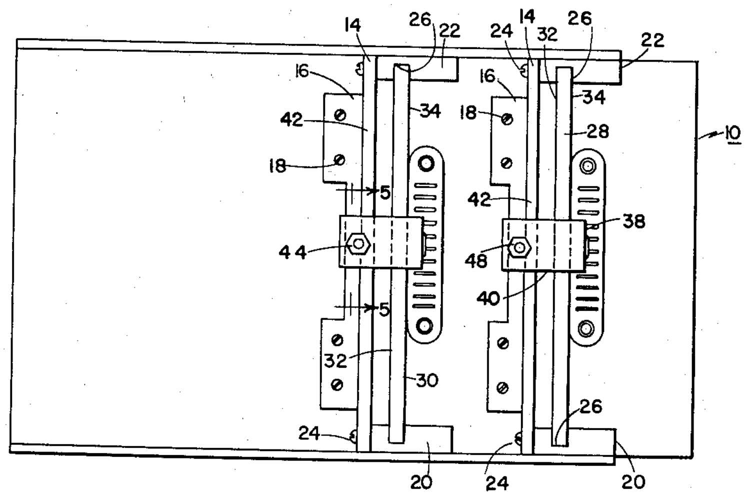
FIG. 1 is a top plan view of one embodiment of this invention.
Figure 2:
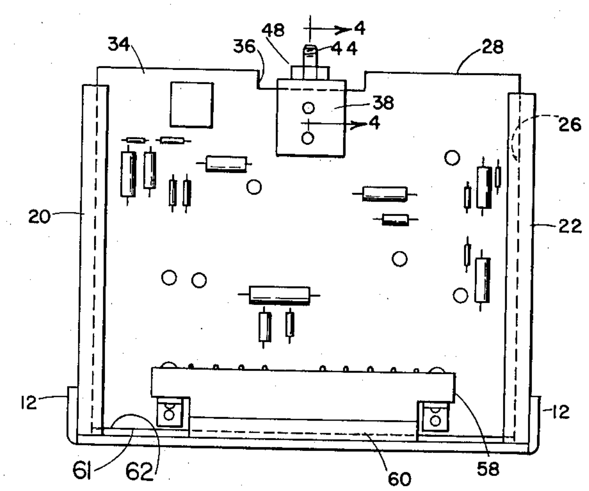
FIG. 2 is a front elevational view thereof.
Figures 3, 4:
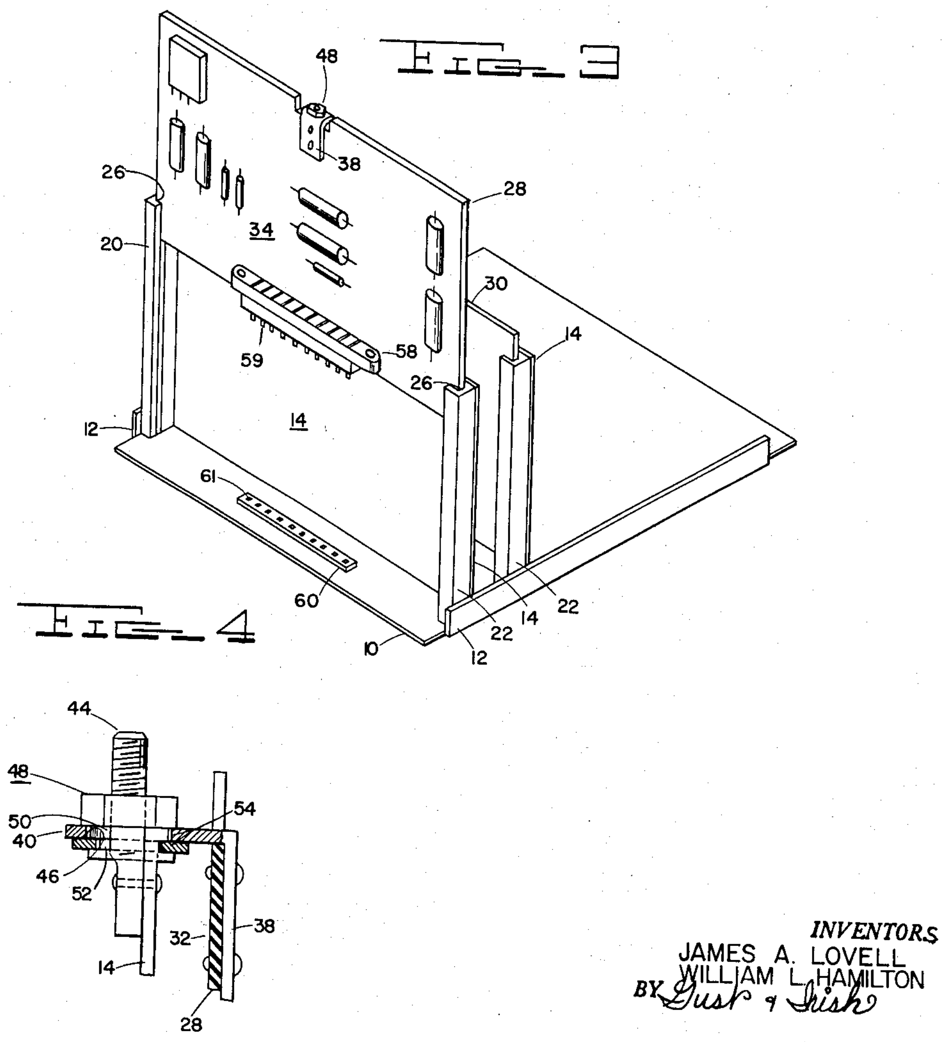
FIG. 3 is a perspective illustration of the same but with one of the circuit boards partially withdrawn from the chassis.
FIG. 4 is an enlarged fragmentary illustration taken substantially along section line 4—4 of FIG. 2.

Referring to the drawings, and more particularly to FIGS. 1, 2 and 3, the radio chassis comprises a sheet metal base plate 10 having two upwardly turned flanges 12 along the opposite lateral edges thereof. A plurality (in the illustrated embodiment, two) of upright, sheet metal mounting plates 14 are mounted on the base plate 10 transversely thereof as more clearly illustrated in FIGS. 1 and 3. Each of the mounting plates extends the full distance between the lateral edges of the base plate 10 and is provided with a right angle flange 16 which is fastened securely to the base plate 10 by means of screws 18 or the like. In the illustrated embodiment, the plates 14 are rectangular in shape. The plates are made sufficiently thick as to be self-supporting and rigid for purposes which will become apparent from the following description.

Secured directly to and supported by each mounting plate 14 is a pair of guide rails indicated respectively by the reference numerals 20 and 22. As seen more clearly in FIGS. 1 and 2, each guide rail 20, 22 is rectangular in cross-section and is elongated to extend from about the full height of the mounting plate 14. The rails are attached to the mounting plate 14 by means of screws 24 which pass through the mounting plate and into the edge portion of the respective rails.

Each rail 20, 22 is provided with an elongated, longitudinally extending groove 26 which faces inwardly, the two grooves 26 in the rails 20 and 22 facing each other as shown in FIG. 1.

Printed circuit boards fit into the grooves 26 of the respective guide rails 20 and 22, the numerals 28 and 30 indicating these boards. They are constructed conventionally, and in one embodement include a self-supporting sheet of insulation having a circuit printed on one side 32 thereof and electrical components mounted on the opposite side 34 thereof. It should be noted at this point that the grooves 26 are spaced sufficiently from the respective mounting plate 14 such that enough clearance will exist between the plate and the side 32 of the circuit board to prevent any portions of the circuit from being short-circuited.

The circuit boards are rectangular in shape and are provided with a notch 36 in the upper edge thereof. Fitted into this notch 36 is a metal, right-angle bracket having one leg 38 riveted securely to the circuit board (see FIG. 4) and the other leg 40 extending over the upper edge 42 of the mounting plate 14.

Riveted or otherwise securely fastened to each mounting plate 14 is a screw 44 which projects upwardly beyond the upper edge 42 and through an opening 46 in the bracket arm 40. Fastened securely to this arm 40 but for rotation with respect thereto is a captive nut 48 which is provided with an axially extending reduced diameter shank portion, indicated generally in FIG. 4 by the reference numeral 50, which is received for rotation by the opening 46. This shank 50 is provided with a groove 52 for receiving a split-retaining ring 54 on the underside of the arm 40. The outer periphery of the ring 54 is larger than the shank 50; hence the ring abuts against the underside of the arm 40 and thereby prevents the nut 48 from being withdrawn from the opening 46. The nut 48 is thereby retained on the arm 40 by the head 56 and the ring 54.

Figure 5:
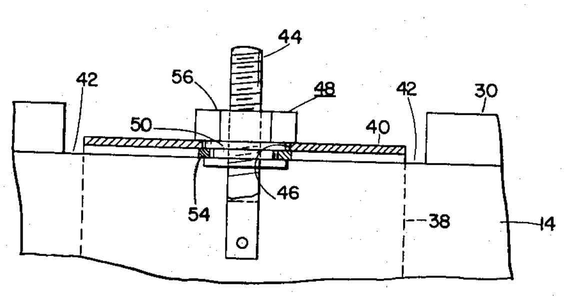
FIG. 5 is another enlarged fragmentary sectional illustration taken substantially along section line 5—5 of FIG. 1.

As shown more clearly in FIGS. 4 and 5, the captive nut 48 threads onto the upright screw 44 with the lower end of the shank 50 of the nut bearing against the upper edge 42 of the mounting plate 14. By this means, the bracket 38, 40 as well as the printed circuit board 28 are securely attached to the mounting plate 14.

A connector assembly is composed of a male-connecting plug 58 and a socket part 60 of which the plug 58 is securely fastened by rivets or the like to the circuit board 28 adjacent to the lower edge thereof and the socket part 60 is securely mounted on the base plate 10. FIG. 2 illustrates these two parts 58 and 60 connected together while FIG. 3 illustrates them as being disconnected. Both said plug 58 and socket 60 have slidably engageable conductive contacts in the form of pins 59 on the plug and metal inserts in the socket 60. Each of the pins 59 fit into a respective opening 61 in the socket 60 to make contact with the insert in the opening. The parts 58 and 60 are conventional. The plug 58 is connected into the circuitry carried by the circuit board 28 while the socket 60 is connected to external circuitry with which the board circuitry functions.

All of the dimensions of the chassis, the printed circuit board, the captive nut-screw assembly 48, 44, and the like are so selected that when the captive nut 48 is fully threaded onto the screw 44 so as to abut the shank 50 against the upper edge 42 of the mounting plate 14, the connector parts 58 and 60 are securely connected together as illustrated in FIG. 2. By turning the captive nut 48 in a direction to unscrew it completely from the screw 44, the printed circuit board 28 is drawn upwardly a distance sufficient to disconnect completely the plug 58 from the socket 60. It is thus apparent that by manipulating the captive nut 48, the plug 58 may be selectively connected to or disconnected from the socket 60.

The grooves 26 and the guide rails 20 and 22 have just enough clearance with the thickness dimension of the printed circuit board 28 so as to slidably receive the latter. Thus, when it is desired to withdraw the circuit board 28 from the chassis to either check it or perform some kind of repair, the captive nut 48 is unthreaded from the screw 44, following which the circuit board 28 is withdrawn completely from the slots 26. Both sides of the circuit board 28 are thus completely exposed for close examination and any repair work that may be necessary. When the circuit board is replaced in the chassis, it is first inserted into the grooves 26 and slid downwardly until the captive nut 28 first engages the upper end of the screw 44. In this position, the male plug 58 is not yet connected to socket 60. Next, the nut 48 is threaded onto the screw 44, whereupon the circuit board 28 is forced downwardly, causing the plug 58 to be forced into the socket 60. When the nut 48 is threaded to its full extent, the circuit board 28 will be fully inserted in its grooves 26 so that the bottom edge 61 of the circuit board will have a slight clearance 62 with the base plate 10 and the connector plug 58 will be completely inserted into the socket 60. This clearance 62 assures that the plug 58 is fully inserted into the socket 60. Since the two parts 58 and 60 normally fit very tightly together, it is indeed difficult to merely manually withdraw the plug from the socket. However, by virtue of the nut 48 and the mechanical advantage it affords, turning the nut 48 on the screw 44 provides a means for easily and quickly separating the connector parts as well as moving the circuit board 28 upwardly far enough so that it may be grasped by the fingers to withdraw it completely from the chassis. Thus, even though the parts in the chassis are spaced so closely together that it would be impossible normally for a person to grasp these parts to gain access thereto, the captive nut arrangement provides a means for overcoming this difficulty. Mere manipulation of this captive nut serves to both connect and disconnect the circuit board from the assembly and it is a simple matter to gain access to this nut 48 by means of a suitable socket wrench or the like.

While the mountnig plates 14 provide support for the respective circuit boards 28 as well as means for locking the circuit boards in place, they also serve as electrostatic shields. Note in FIGS. 1 and 3 that the circuit board 28 is shielded from circuit board 30 by means of one of the mounting plates 14. It will thus become apparent to the person skilled in the art that a plurality of the mounting plate-circuit board assemblies may be installed on the base plate 10 and that each circuit board may be individually inserted in and removed from the total assembly. Moreover, the circuit boards are electrostatically shielded from each other.

The mechanical and electrical portions of the invention intimately cooperate with each other in achieving the compact, rigid structure just described. The circuit board itself is a structural part of the locking mechanism, since it serves as a connection between the plug part 58 and the captive nut-screw assembly 44, 48. The respective mounting plate 14 is also a part of the locking device, but in addition, as already explained, serves as a support as well as an electrostatic shield.

While I have described above the principles of my invention in connection with specific apparatus, it is to be clearly understood that this description is made only by way of example and not as a limitation to the scope of my invention.

What is claimed is:

An electronic chassis comprising a base plate having spaced-apart lateral edges, a pair of metallic mounting plates mounted in an upright position on said base plate, said mounting plates being spaced apart and parallel and extending the full distance between said lateral edges, each said mounting plate having a pair of elongated guide rails mounted on one side adjacent to the opposite lateral edges thereof, said guide rails being upright and having longitudinally extending upright grooves, respectively, facing each other, each said mounting plate having an upper edge and a screw affixed thereto to extend upwardly beyond said upper edge, a circuit board slidably received by said grooves in one pair of said guide rails, said circuit board being of substantially the same size and shape as said mounting plates, said circuit board having an upper edge fitted with a bracket which overlies the upper edge of said mounting plate in registry with said screw, a nut fixedly mounted for rotation on said bracket and threaded onto said screw, said circuit board having a lower edge, a circuit-connecting assembly including two connecting parts, one of said parts having at least one connecting pin, the other of said parts having a socket for receiving said pin, one of said parts being mounted on said circuit board, and the other of said parts being mounted on said base plate in such position that said pin is received by said socket, said screw being of such length that turning said nut in one direction serves to move said circuit board a distance sufficient to withdraw said pin from said socket.

References Cited in the file of this patent

UNITED STATES PATENTS

| | | |
|---|---|---|
| 2,417,420 | Knapp | Mar. 18, 1947 |
| 2,641,635 | Scal | June 9, 1953 |
| 2,832,013 | Pedersen | Apr. 22, 1958 |